(12) United States Patent
Fang et al.

(10) Patent No.: US 9,865,543 B1
(45) Date of Patent: Jan. 9, 2018

(54) STRUCTURE AND METHOD FOR INHIBITING COBALT DIFFUSION

(71) Applicant: GLOBALFOUNDRIES INC., Grand Cayman (KY)

(72) Inventors: Qiang Fang, Ballston Lake, NY (US); Haigou Huang, Rexford, NY (US); Stan Tsai, Clifton Park, NY (US); John H. Zhang, Altamont, NY (US); Xingzhao Shi, Clifton Park, NY (US); Tai Fong Chao, Halfmoon, NY (US)

(73) Assignee: GLOBALFOUNDRIES INC., Grang Cayman (KY)

( * ) Notice: Subject to any disclaimer, the term of this patent is extended or adjusted under 35 U.S.C. 154(b) by 0 days.

(21) Appl. No.: 15/416,152

(22) Filed: Jan. 26, 2017

(51) Int. Cl.
| | |
|---|---|
| *H01L 21/768* | (2006.01) |
| *H01L 23/532* | (2006.01) |
| *H01L 21/82* | (2006.01) |
| *H01L 23/528* | (2006.01) |
| *H01L 21/321* | (2006.01) |
| *H01L 21/8238* | (2006.01) |
| *H01L 21/8234* | (2006.01) |

(52) U.S. Cl.
CPC ...... *H01L 23/5283* (2013.01); *H01L 21/3212* (2013.01); *H01L 21/7685* (2013.01); *H01L 21/76802* (2013.01); *H01L 21/76843* (2013.01); *H01L 21/76877* (2013.01); *H01L 21/823475* (2013.01); *H01L 21/823871* (2013.01); *H01L 23/53209* (2013.01)

(58) Field of Classification Search
CPC .... H01L 21/768–21/76898; H01L 21/823475; H01L 21/823871; H01L 27/10855; H01L 23/53257–23/53266
See application file for complete search history.

(56) References Cited

U.S. PATENT DOCUMENTS

2016/0211251 A1* 7/2016 Liaw ................. H01L 21/76897

\* cited by examiner

*Primary Examiner* — Thanhha Pham
(74) *Attorney, Agent, or Firm* — Scully Scott Murphy and Presser; Frank DiGiglio

(57) ABSTRACT

A process for forming a conductive structure includes the formation of a self-aligned, inlaid conductive cap over a cobalt-based contact. The inlaid conductive cap is formed using a damascene process by depositing a conductive layer comprising tungsten or copper over a recessed cobalt-based contact, followed by a CMP step to remove excess portions of the conductive layer. The conductive cap can cooperate with a liner/barrier layer to form an effective barrier to cobalt migration and oxidation.

12 Claims, 3 Drawing Sheets

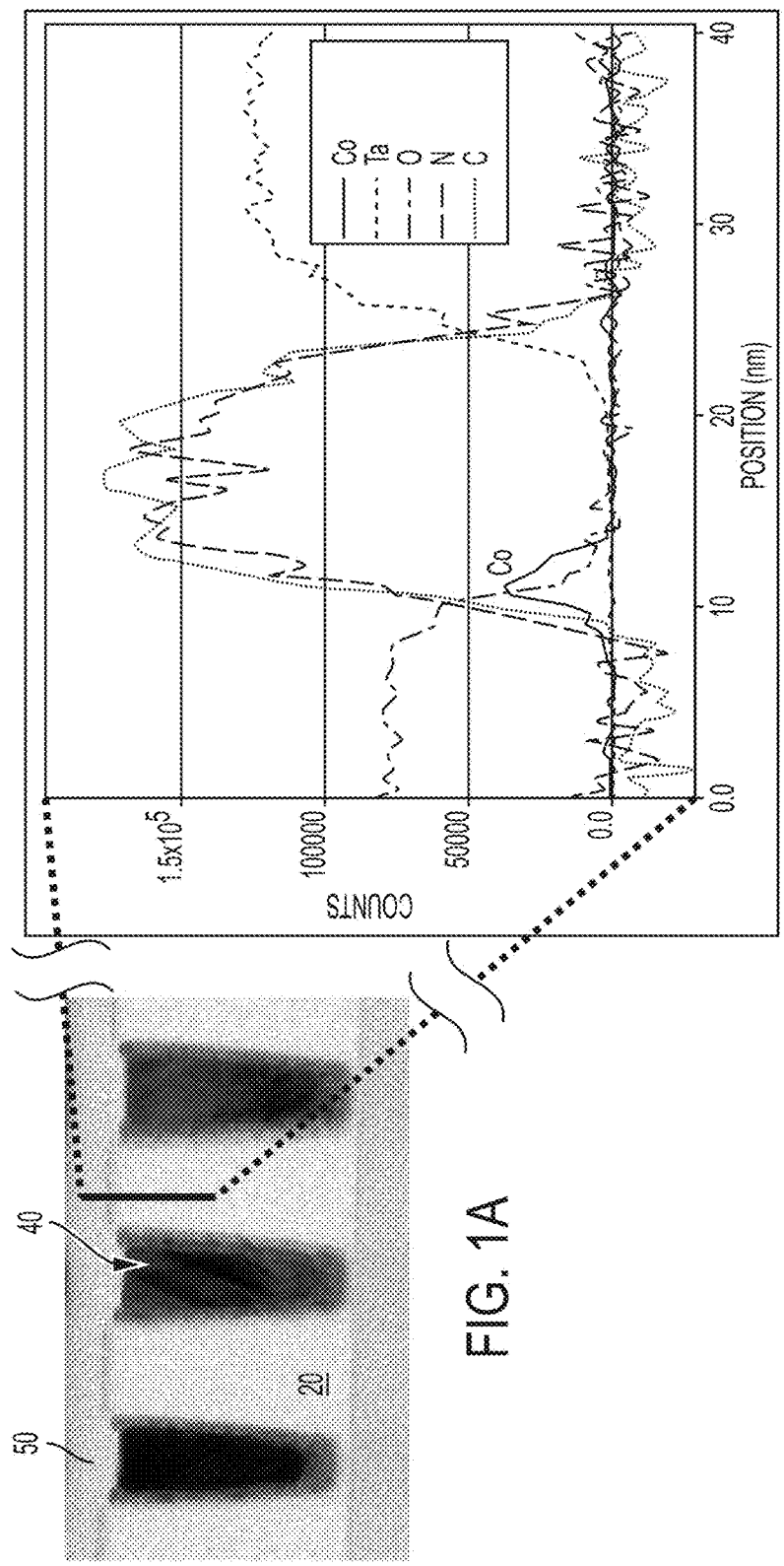

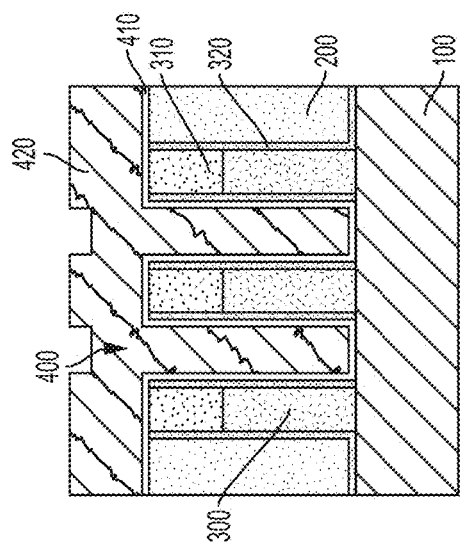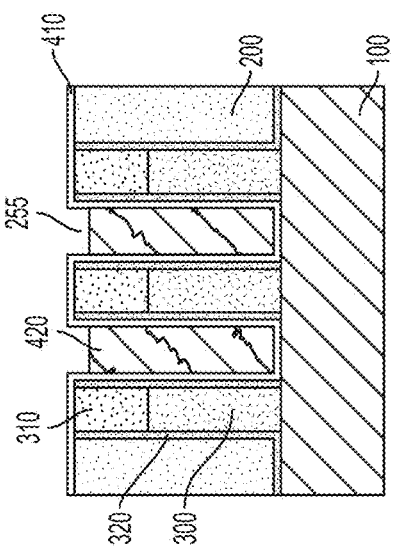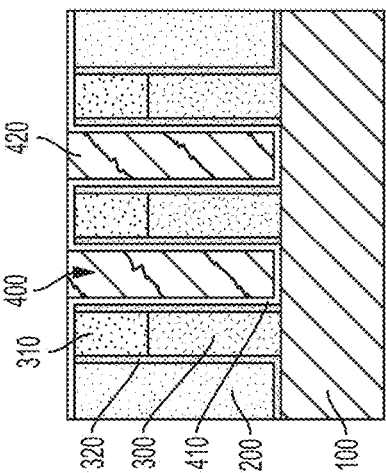

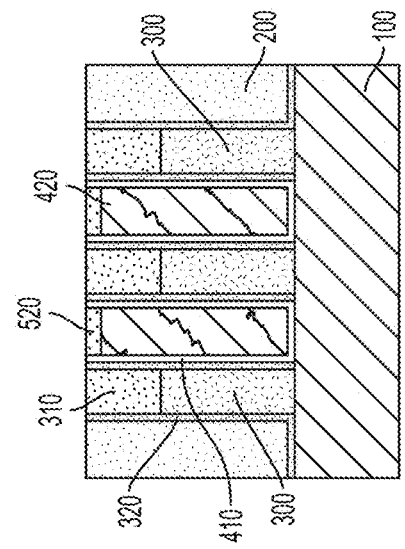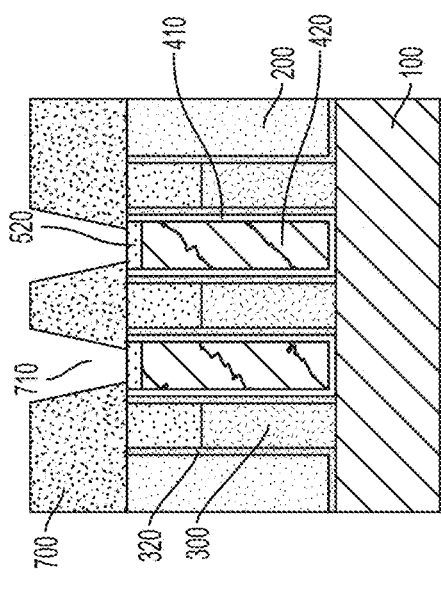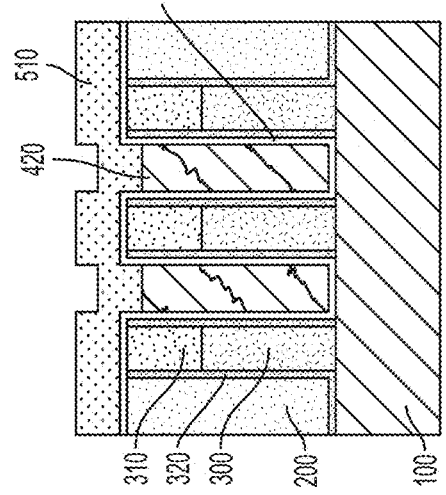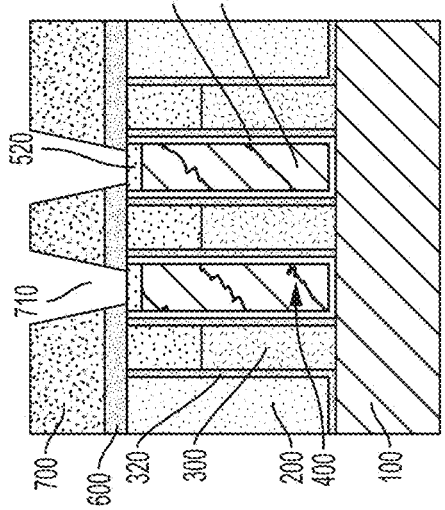
FIG. 6
FIG. 8
FIG. 7
FIG. 9

STRUCTURE AND METHOD FOR INHIBITING COBALT DIFFUSION

BACKGROUND

The present application relates generally to conductive interconnect structures, and more specifically to cobalt-based interconnect structures and capping layers that inhibit the oxidation and migration of cobalt.

Electrically-conductive connections between integrated circuit (IC) devices formed in a semiconductor substrate are traditionally made using multi-layer interconnects. Each interconnect layer can be supported over the substrate by an interlayer dielectric or other material layers. Furthermore, electrical connections to and between different conductive layers are commonly made using contacts in the form of plugs that traverse one or more layers of the interlayer dielectric.

Typical interconnect structures comprise copper (Cu) or tungsten (W). Copper is advantageous because of its low electrical resistivity. However, copper is susceptible to electromigration and void formation, which can lead to device failure, while the precursors used during tungsten CVD processes are highly reactive with silicon and associated barrier layer/liner materials. Thus, tungsten is particularly sensitive to defects (e.g., pin-hole defects) in the barrier layer architecture used to isolate the tungsten interconnects from the barrier layer metal and silicon. In addition, tungsten resistance cannot be decreased with post-deposition annealing as it is a refractory metal and does not undergo recrystallization or grain growth at thermal budgets that are compatible with most semiconductor manufacturing. Moreover, the barrier and nucleation layer thicknesses for tungsten-based metallization are not scaling to meet resistance requirements at advanced nodes.

An alternative interconnect material to copper and tungsten is cobalt. Due to a higher activation energy, cobalt is less prone to electromigration compared to copper, and is compatible with thin barrier layer architectures, which can be especially advantageous at advanced nodes, e.g., less than 14 nm. Processing subsequent to the formation of cobalt contacts, however, including the deposition of an overlying interlayer dielectric, can induce unwanted oxidation, diffusion and/or migration of cobalt. Cobalt oxidation can undesirably increase contact resistance. Migration of cobalt can lead to electrical shorts between adjacent structures, which can adversely affect device performance and reliability.

Various approaches to capping cobalt contacts, including the capping of cobalt contacts with dielectric materials such as silicon oxynitride, have been shown to be ineffective at inhibiting cobalt migration. For instance, FIG. 1A is a cross-sectional micrograph showing a plurality of comparative cobalt contacts 40 embedded within an interlayer dielectric 20 with a dielectric capping layer 50 formed over the contacts 40. FIG. 1B is an elemental line scan across the highlighted region of FIG. 1A showing the undesired migration of cobalt to regions of the structure between adjacent contacts following formation of a dielectric capping layer over the interlayer dielectric.

SUMMARY

In view of the foregoing, it would be advantageous to develop methods and structures for efficiently and effectively capping cobalt-based contacts. In accordance with embodiments of the present application, a process for forming cobalt-based contacts that mitigates cobalt migration includes forming a trench over a semiconductor substrate and between adjacent gate stacks of a device such as a transistor, and forming a conformal barrier layer within the trench and extending laterally over the adjacent gate stacks. A cobalt-containing layer is then deposited over the barrier layer to fill the trench. Using the barrier layer as an etch stop, portions of the cobalt-containing layer outside of the trench are removed, i.e., from over the gate stacks, and remaining portions of the cobalt-containing layer are then recessed within the trench.

A conductive capping layer comprising tungsten or copper is formed over the recessed cobalt-containing layer to backfill the trench. A planarization process can be used to form an inlaid conductive capping layer comprising the tungsten or copper having a top surface that is substantially co-planar with a top surface of layers adjacent to the trench. The tungsten- or copper-containing conductive capping layer is an effective barrier to cobalt migration and oxidation.

In further embodiments, a semiconductor structure comprises adjacent gate stacks disposed over a semiconductor substrate, and a dielectric capping layer (i.e., gate cap) disposed over each of the gate stacks. A cobalt-containing conductive contact extends between the adjacent gate stacks and over the semiconductor substrate.

An inlaid conductive capping layer is disposed directly over the conductive contact, such that a top surface of the inlaid conductive capping layer is co-planar with the dielectric capping layers. The inlaid conductive capping layer includes tungsten or copper.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 1A is a cross-sectional micrograph showing a plurality of comparative cobalt contacts with a dielectric capping layer disposed over the contacts;

FIG. 1B is an elemental line scan showing the migration of cobalt to regions of the structure of FIG. 1A between adjacent contacts;

FIG. 2 is a cross-sectional schematic showing the formation of trenches between adjacent gate stacks and over source/drain regions of a semiconductor substrate;

FIG. 3 illustrates the formation of a conformal barrier layer within the trenches and over the gate stacks, and the deposition of cobalt contacts over the barrier layer within the trenches;

FIG. 4 shows planarization of the cobalt contacts using the barrier layer as an etch stop layer;

FIG. 5 depicts a recess etch of the cobalt contacts to a height between a top surface of the adjacent gate caps and a top surface of the gate stacks underlying the gate caps;

FIG. 6 shows the deposition of a conductive capping layer of tungsten or copper over the recessed cobalt contacts and over the adjacent architecture;

FIG. 7 shows planarization of the conductive capping layer and removal of the barrier layer from over the gate stacks outside of the trenches;

FIG. 8 depicts the formation of a barrier layer over the structure of FIG. 7 prior to forming an interlayer dielectric according to several embodiments; and FIG. 9 depicts the formation of an interlayer dielectric directly over the structure of FIG. 7 according to several embodiments.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

Referring to FIG. 2, a dielectric layer 200 is disposed over a semiconductor substrate 100. The semiconductor substrate 100 may be bulk semiconductor substrate or a hybrid substrate such as a semiconductor-on-insulator (SOI) substrate, and may include active and passive devices, such as transistors, capacitors, resistors, etc. According to various embodiments, the illustrated portion of the substrate 100 may be the cross-section of a semiconductor fin used to form a FinFET device, for example.

Dielectric layer 200 may comprise any suitable insulating or dielectric material including oxides, nitrides and oxynitrides, such as silicon dioxide, silicon nitride, silicon oxynitride, SiOC, SiOCN and SiBCN, as well as other low dielectric constant (low-k) materials. As used herein, a "low-k" material has a dielectric constant less than that of silicon dioxide.

Exemplary low-k materials include, but are not limited to, amorphous carbon, fluorine-doped oxides, and carbon-doped oxides. Commercially-available low-k dielectric products and materials include Dow Corning's SiLK™ and porous SiLK™, Applied Materials' Black Diamond™, Texas Instrument's Coral™ and TSMC's Black Diamond™ and Coral™.

Although only a single dielectric layer 200 is shown, it will be appreciated that dielectric layer 200 may comprise multiple dielectric layers of the same or different composition.

Plural gate stacks 300 are disposed over the semiconductor substrate and laterally spaced from each other by dielectric layer 200. As will be appreciated by those skilled in the art, gate stacks 300 comprise a gate dielectric and a gate conductor (not separately shown), which may be deposited in succession. The gate dielectric may be a conformal layer that is formed directly over the semiconductor substrate. The gate dielectric may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric may be deposited by a suitable process such as atomic layer deposition (ALD), chemical vapor deposition (CVD), physical vapor deposition (PVD), thermal oxidation, UV-ozone oxidation, or combinations thereof. A high-k gate dielectric thickness may range from 10 nm to 50 nm, e.g., 10, 20, 30, 40 or 50 nm, including ranges between any of the foregoing values. In various embodiments, the gate dielectric includes a thin layer (e.g., 0.5 nm) of silicon oxide and an overlying layer of high-k dielectric material.

A gate conductor is formed over the gate dielectric, which together define a gate stack 300 according to certain embodiments. The gate conductor may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of one or more conductive metals, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may comprise one or more layers of such materials such as, for example, a metal stack including a barrier layer, work function layer, and conductive fill layer.

The gate conductor may be a conformal layer that is formed directly over the gate dielectric. The gate conductor can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition. The gate conductor thickness may range from 5 nm to 50 nm, e.g., 5, 10, 15, 20, 30, 40 or 50 nm, including ranges between any of the foregoing values.

In various embodiments, a dielectric gate cap 310 comprising, for example, a nitride material such as silicon nitride or silicon oxynitride (SiON), is formed directly over the gate stack 300. Sidewall spacers 320 are disposed over sidewalls of the gate stack 300 and overlying gate cap 310. Sidewall spacers 320 may comprise an oxide, nitride or oxynitride, such as silicon dioxide ($SiO_2$), silicon carbon nitride (SiCN), silicon nitride ($Si_3N_4$), or another dielectric material. In various embodiments, the width of each sidewall spacer 320, as measured at the base of the spacer, may range from 5 nm to 100 nm, although lesser and greater widths can be used.

As shown in FIG. 2, trenches 250 may be formed between adjacent gate stacks 300 by removal of dielectric layer 200. A trench 250 is formed in the dielectric layer 200 between adjacent gate stacks to expose, for example, a conductive layer or region within or on the substrate 100. Trench 250 may be formed using patterning and etching processes known to those skilled in the art. The patterning process may comprise photolithography, for example, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the underlying dielectric layer or dielectric layers utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used. Trenches 250 may have a width (W) ranging from 15 to 30 nm, for example, although lesser and greater widths may be used. In various embodiments, the trench sidewalls are defined by the sidewall spacers 320.

Referring to FIG. 3, a conductive cobalt contact 400 is formed within trenches 250. Prior to forming the cobalt contact 400, a conformal barrier layer 410 is formed within each trench 250. For instance, the barrier layer 410 may comprise one or more layers of tantalum, tantalum nitride, titanium or titanium nitride. In various embodiments, the barrier layer 410 comprises a line-of-sight deposited (PVD) or conformal (ALD/CVD) layer of titanium (Ti) formed over exposed surfaces of the semiconductor substrate 100 and sidewall spacers 320 within trench 250, and a conformal layer of titanium nitride (TiN) formed over the layer of titanium. As shown in the illustrated embodiment, the barrier layer 410 is formed over a top surface of the dielectric layer 200 and over a top surface of the gate cap 310. In various embodiments, the barrier layer 410 prevents cobalt from diffusing into gate stacks 300 and gate caps 310. The thickness of the one or more layers that form the barrier layer 410 may independently range from 2 nm to 10 nm, e.g., 2, 4, 6, 8 or 10 nm, including ranges between any of the foregoing values.

In various embodiments, to form cobalt contacts 400, a cobalt seed layer (not shown) is initially deposited on the sidewalls and the bottom surface of the trench 250, e.g., directly on barrier layer 410. Cobalt seed layer may be a conformal layer having a thickness of 1 to 5 nm, e.g., 1, 2, 3, 4, or 5 nm, including ranges between any of the foregoing values. The seed layer may be formed using chemical vapor deposition (CVD), physical vapor deposition (PVD), atomic layer deposition (ALD), electroplating, electroless plating or other suitable process for creating a conformal thin film. Cobalt seed layer may comprise cobalt and, as will be appreciated by those skilled in the art, may be adapted to serve as a nucleation layer for the deposition of a fill material used to fill trench 250.

A fill material 420 may be deposited on exposed surfaces of the seed layer, if present, or directly on exposed surfaces within the trench 250 to form a cobalt contact 400 that substantially fills the trench 250. The fill material 420 may comprise cobalt metal or a cobalt alloy. The fill material 420 may be deposited by CVD, PVD, ALD, electroplating, or electroless plating, for example.

As used herein, a cobalt contact 400 comprises cobalt, and may include elemental cobalt as well as alloys and mixtures that contain cobalt. In certain embodiments, the fill material 420 and the seed layer have the same composition. In alternate embodiments, the fill material 420 and the seed layer have different compositions. By way of example, the composition of the seed layer and the composition of fill material 420 may be independently chosen from elemental cobalt (Co) and cobalt alloyed with up to 50 atomic percent of one or more of B, C, N, Mg, Al, Si, P, Ti, V, Cr, Mn, Fe, Ni, Cu, Zn, Ge, Zr, Nb, Mo, Ru, Rh, Pd, Ag, Hf, Ta, W, Re, Ir, Pt and Au.

Illustrated in FIG. 4 is an intermediate, post-planarization architecture comprising a cobalt contact 400 disposed between adjacent gate stacks. As will be appreciated by those skilled in the art, a planarization process can be used to remove the overburden, i.e., portions of the seed layer and fill material 420 deposited outside of trench 250, i.e., over a top surface of the dielectric layer 200 and the gate cap 310, to form a global planarized surface. A top surface of barrier layer 410 may serve as an etch stop layer. In certain embodiments, a surface of the cobalt contact 400 is substantially co-planar with a surface of the barrier layer 410. In certain embodiments, as a result of the planarization process, a surface of the cobalt contact 400 is recessed below a surface of the barrier layer 410.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Referring to FIG. 5, an etching step is used to recess the fill material 420 (and the seed layer, if present) within the previously-filled trench 250. The etching step may comprise a dry etching process such as, for example, reactive ion etching. In other embodiments, a wet chemical etchant can be used. In still further embodiments, a combination of dry etching and wet etching can be used to recess the fill material 420. The fill material 420 may be recessed to have a height that is between a height of the gate stack 300 and a height of the gate cap 310.

Referring to FIG. 6, a conductive layer 510 is formed over the architecture of FIG. 4. In the illustrated embodiment, the conductive layer 510 is deposited directly over exposed portions of fill material 420, i.e., directly over cobalt contact 400. The conductive layer 510 is deposited over the cobalt contact 400 at a thickness sufficient to completely backfill the recess 255 formed in via 250.

Various methods can be used to form conductive layer 510, including physical vapor deposition (PVD) and chemical vapor deposition (CVD). By way of example, a physical vapor deposition (PVD) method to form conductive layer 510 includes selecting a target material comprising cobalt, introducing a sputtering gas to a reaction chamber comprising the semiconductor substrate and the target material, and forming a plasma in an atmosphere of the sputtering gas to sputter atoms from the target material to the semiconductor substrate to form the conductive layer 510 on the substrate, i.e., over the cobalt contact 400 and over exposed surfaces of barrier layer 410. The sputtering gas can comprise one or more of helium, nitrogen and argon. According to various embodiments, conductive layer 510 comprises tungsten or copper, e.g., elemental tungsten, elemental copper, as well as alloys and mixtures thereof.

Referring to FIG. 7, a CMP step can be used to remove the conductive layer overburden as well as portions of the barrier layer 410 outside of trench 250 to form a planarized structure, where remaining portions of the conductive layer 510 define inlaid capping layers 520. During the CMP step, portions of the dielectric layer 200, gate cap 310, sidewall spacers 320 and barrier layer 410 may be removed. In the illustrated embodiment, a top surface of the inlaid capping layers 520 are co-planar with a top surface of the dielectric layer 200, gate cap 310 and remaining portions of the barrier layer 410.

In various embodiments, referring to FIG. 8, a blanket capping layer 600 may be formed over the planarized structure. In various embodiments, the capping layer 600 is an oxygen-free dielectric layer. The oxygen-free dielectric layer may include silicon nitride (SiN), silicon carbide (SiC), silicon carbonitride (SiCN), or the like. Capping layer 600 may be deposited using e.g., chemical vapor deposition (CVD), plasma enhanced CVD (PECVD), low pressure CVD (LPCVD), or other deposition techniques, and may have a thickness of, for example, 10 to 50 nm, e.g., 10, 20, 30, 40 or 50 nm, including ranges between any of the foregoing values. In the illustrated embodiment, capping layer 600 is formed directly over a top surface of the inlaid conductive capping layer 520 and directly over a top surface of the dielectric layer 200 and gate cap 310.

Referring still to FIG. 8, an interlayer dielectric layer 700 can be formed over the capping layer 600. As will be appreciated by those skilled in the art, contact vias 710 can be formed in the dielectric layer 700 and can extend through capping layer 600 using the patterning and etching processes as described above in conjunction with vias 250, and contacts (not shown) can be formed in the contact vias 710 using, for example, chemical vapor deposition, physical vapor deposition, electroplating or electroless plating. In various embodiments, the contacts extend through dielectric layer 700 and capping layer 600 and are in electrical contact with inlaid capping layers 520. The contacts may comprise any suitable conductive material.

Referring to FIG. 9, shown is an alternate embodiment to the structure of FIG. 8, where capping layer 600 is omitted and dielectric layer 700 is formed directly over the planarized structure of FIG. 7.

The methods and structures of the present application provide a conductive, self-aligned and inlaid capping layer 520 over a cobalt contact 400. In certain embodiments, the capping layer is substantially co-planar with dielectric layer 200 and laterally adjacent gate cap 310, and presents an etch-selective layer for forming electrical contact to the cobalt contact. The conductive capping layer 520 can cooperate with barrier layer 410 to form an effective barrier to the oxidation or migration of cobalt. In certain embodiments, an interface between the interlayer dielectric 700 and the gate cap 310 (or between the interlayer dielectric and the capping layer 600, if present) is substantially free of cobalt.

As used herein, the singular forms "a," "an" and "the" include plural referents unless the context clearly dictates otherwise. Thus, for example, reference to a "contact" includes examples having two or more such "contacts" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a contact that comprises cobalt include embodiments where a contact consists essentially of cobalt and embodiments where a contact consists of cobalt.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor device, comprising:
    forming a trench between adjacent gate stacks and over a semiconductor substrate;
    forming a conformal barrier layer within the trench and extending laterally over the gate stacks;
    forming a cobalt-containing layer over the conformal barrier layer and filling the trench;
    removing the cobalt-containing layer from over the gate stacks using the conformal barrier layer as an etch stop;
    recessing the cobalt-containing layer within the trench; and
    forming a conductive capping layer over the recessed cobalt-containing layer and filling the trench, wherein the conductive capping layer comprises a metal selected from a group consisting of tungsten and copper.

2. The method of claim 1, further comprising polishing the conductive capping layer and the conformal barrier layer to form an inlaid conductive capping layer having a top surface that is co-planar with a top surface of the barrier layer.

3. The method of claim 2, wherein the top surface of the inlaid conductive capping layer is co-planar with a top surface of a dielectric capping layer disposed over the gate stack.

4. The method of claim 3, further comprising forming a nitride capping layer over the inlaid conductive capping layer and over the dielectric capping layer.

5. The method of claim 4, wherein the nitride capping layer is formed directly over a top surface of the inlaid conductive capping layer and directly over a top surface of the dielectric capping layer.

6. The method of claim 3, further comprising forming an interlayer dielectric over the inlaid conductive capping layer and over the dielectric capping layer.

7. The method of claim 6, wherein an interface between the interlayer dielectric and the dielectric capping layer is substantially free of cobalt.

8. The method of claim 1, wherein a sidewall spacer is disposed over sidewall surfaces of the adjacent gate stacks, and forming the trench exposes the sidewall spacers.

9. The method of claim 1, wherein forming the trench exposes the semiconductor substrate at a bottom of the trench.

10. The method of claim 1, wherein forming the conformal barrier layer comprises forming a layer of titanium and forming a layer of titanium nitride over the layer of titanium.

11. The method of claim 1, wherein removing the cobalt-containing layer from over the gate stacks comprises chemical mechanical polishing.

12. The method of claim 1, wherein the cobalt-containing layer is recessed to a height between a top surface of a dielectric capping layer disposed over the gate stack and a top surface of the adjacent gate stacks.

* * * * *